US012757363B2

(12) United States Patent
Jokelainen et al.

(10) Patent No.: US 12,757,363 B2
(45) Date of Patent: Oct. 6, 2026

(54) CROSS FLOW HEAT TRANSFER APPARATUS

(71) Applicant: Kuori Oy, Espoo (FI)

(72) Inventors: Jarkko Jokelainen, Espoo (FI); Huiyang Yu, Espoo (FI); Daniel Legendre, Espoo (FI)

(73) Assignee: Kuori Oy, Espoo (FI)

( * ) Notice: Subject to any disclaimer, the term of this patent is extended or adjusted under 35 U.S.C. 154(b) by 401 days.

(21) Appl. No.: 18/550,625

(22) PCT Filed: Mar. 17, 2022

(86) PCT No.: PCT/FI2022/050171

§ 371 (c)(1),
(2) Date: Sep. 14, 2023

(87) PCT Pub. No.: WO2022/214734

PCT Pub. Date: Oct. 13, 2022

(65) Prior Publication Data

US 2024/0298430 A1 Sep. 5, 2024

(30) Foreign Application Priority Data

Apr. 8, 2021 (FI) ...................................... 20217064

(51) Int. Cl.
*H05K 7/20* (2006.01)

(52) U.S. Cl.
CPC ..... *H05K 7/20972* (2013.01); *H05K 7/20963* (2013.01)

(58) Field of Classification Search
CPC ........... H05K 7/20972; H05K 7/20963; H05K 7/20954; G06F 1/206; H10W 40/43
(Continued)

(56) References Cited

U.S. PATENT DOCUMENTS

2004/0036563 A1 2/2004 Seaton et al.
2005/0168943 A1 8/2005 Bang et al.
(Continued)

FOREIGN PATENT DOCUMENTS

CN 101971081 A 2/2011
CN 104123886 A 10/2014
(Continued)

OTHER PUBLICATIONS

European Patent Office, International Search Report and Written Opinion of the International Searching Authority, Application No. PCT/FI2022/050171, Jun. 15, 2022, 17 pages.
(Continued)

*Primary Examiner* — Mandeep S Buttar
*Assistant Examiner* — Kyle Oxenknecht
(74) *Attorney, Agent, or Firm* — Ziegler IP Law Group, LLC.

(57) ABSTRACT

Disclosed is a cross flow heat transfer apparatus for combined arrangement with an electronic display and integrated circuit chamber. The cross flow heat transfer apparatus comprising external heatsink configured to be arranged between electronic display and integrated circuit chamber, wherein external heatsink, with plurality of vertically-oriented fins, is configured to mediate cross flow heat transfer mechanism between electronic display and integrated circuit chamber. The cross flow heat transfer mechanism has internal flow driven by set of internal fans associated with internal heatsink coupled with integrated circuit chamber, wherein internal flow is directed transversally towards electronic display from the integrated circuit chamber, and external flow driven by plurality of vertically-oriented fins of external heatsink based on temperature gradient.

9 Claims, 7 Drawing Sheets

(58) Field of Classification Search
USPC .......................................................... 361/715
See application file for complete search history.

(56) References Cited

U.S. PATENT DOCUMENTS

| | | | | |
|---|---|---|---|---|
| 2009/0129021 | A1 | 5/2009 | Dunn | |
| 2011/0013114 | A1* | 1/2011 | Dunn | H05K 7/202<br>349/61 |
| 2012/0236499 | A1* | 9/2012 | Murayama | H05K 7/20972<br>361/696 |
| 2020/0241612 | A1* | 7/2020 | Moon | H05K 7/20336 |
| 2020/0390009 | A1 | 12/2020 | Whitehead et al. | |
| 2021/0267090 | A1* | 8/2021 | Saito | G02F 1/133308 |

FOREIGN PATENT DOCUMENTS

| | | | | |
|---|---|---|---|---|
| EP | 3267773 | A1 | 1/2018 | |
| IT | 201600069274 | A1 * | 1/2018 | H05K 7/20954 |
| JP | 3141742 | U | 5/2008 | |
| KR | 20190104977 | A | 9/2019 | |
| TW | 201945892 | A | 12/2019 | |
| WO | 2013182733 | A1 | 12/2013 | |
| WO | 2019026005 | A1 | 2/2019 | |
| WO | WO-2019179076 | A1 * | 9/2019 | F24F 13/24 |
| WO | 2020115532 | A1 | 6/2020 | |

OTHER PUBLICATIONS

Finnish Patent and Registration Office, Search Report, Application No. 20217064, Sep. 30, 2021, 2 pages.
China National Intellectualproperty Administration, First Office Action, Application No. 202280025949.X, Mar. 20, 2026, 9 pages.

* cited by examiner

| Combination | 104A | 118A | 118B | 104B |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

FIG. 5A

| Combination | 104A | 118A | 118B | 104B |
|---|---|---|---|---|
| 0 | 0 | 0 | 0 | 0 |
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1 | 1 | 1 | 1 |

FIG. 5B

CROSS FLOW HEAT TRANSFER APPARATUS

TECHNICAL FIELD

The present disclosure relates generally to heat transfer systems; and more specifically to cross flow heat transfer apparatuses for combined arrangements comprising electronic displays and integrated circuit chambers.

BACKGROUND

Convection and conduction are generally used in heat transfer systems for cooling display screens and integrated circuits. In this regard, cooling fans, increasing wind speed and surface area of the heat sinks may be used for heat transfer with the surroundings. Nowadays as technologies evolve and the price per area of screens decreases, there has been an increase in demand for larger screen sizes for both domestic and industrial purposes. Notably, simple configurations of open convective and/or conductive elements have been used and proven to be satisfactory for relative mild outdoors environments. However, the aforementioned configuration cannot withstand harsh environments such as direct solar radiation that in many applications can deliver an effective heating rate of an order of magnitude of 500 $W/m^2$. Moreover, the applied direct heat towards the display screen of a device, while functioning at high brightness levels, may reduce the performance of the device. Furthermore, the natural high temperatures of tropical and desert-like climates also account for increasing the temperature of the display screens and thereby reducing the performance of the device.

On the other side of the outdoors temperature spectrum, low temperatures and dark environments in which minimal brightness is generally used for providing comfort to the eyes of the user, that generates low heat to the display, other limitations may arise, nevertheless an efficient heat transfer mechanism is still needed. In such cases, the devices may suffer failure due to glass contraction cracking, or internal display fluid freeze that can generate internal stresses on the display and malfunctioning due to these low temperatures. Hence the need for a heat transfer mechanism that can work ambivalently on both high and low extreme conditions is an interesting challenge to be addressed.

Notably, the dust issues can be addressed with the use of filters, thereby implying a further extra maintenance step (cleaning or replacing filters). Moreover, this makes the apparatus less cost-effective in areas with high dust or floating particles concentrations.

Therefore, in light of the foregoing discussion, there exists a need to overcome the aforementioned drawbacks associated with the conventional heat transfer systems.

SUMMARY

The present disclosure seeks to provide a cross flow heat transfer apparatus for a combined arrangement comprising an electronic display and an integrated circuit chamber. The present disclosure seeks to provide a solution to the existing problem of heat transfer mechanism. An aim of the present disclosure is to provide a solution that overcomes at least partially the problems encountered in prior art, and provides an efficient and robust system for heat transfer.

In one aspect, an embodiment of the present disclosure provides a cross flow heat transfer apparatus for a combined arrangement comprising an electronic display and an integrated circuit chamber, the cross flow heat transfer apparatus comprising:

- an external heatsink configured to be arranged between the electronic display and the integrated circuit chamber, wherein the external heatsink, comprising a plurality of vertically-oriented fins, is configured to mediate a cross flow heat transfer mechanism between the electronic display and the integrated circuit chamber, wherein the cross flow heat transfer mechanism comprising:
  - an internal flow driven by a set of internal fans associated with an internal heatsink coupled with the integrated circuit chamber, wherein the internal flow is directed transversally towards the electronic display from the integrated circuit chamber, and
  - an external flow driven by the plurality of vertically-oriented fins of the external heatsink based on a temperature gradient.

Embodiments of the present disclosure substantially eliminate or at least partially address the aforementioned problems in the prior art, and enable effective temperature control for electronic display through cross flow heat transfer mechanism. Beneficially, the disclosed cross flow heat transfer apparatus is hermetically sealed and provides efficient cross-flow heat transfer mechanism (effective heating and cooling) on demanding conditions. Additionally, the cross flow heat transfer apparatus is configured with a heat generating element to provide the heat energy to keep the internal temperature of the device in viable ranges at extremely low temperatures.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein:

FIGS. 5A and 5B are tables showing various combinations of an entry cone and an exit cone of a first set of cavities and a second set of cavities, in accordance with various embodiments of the present disclosure.

DETAILED DESCRIPTION OF EMBODIMENTS

Figure 1A:
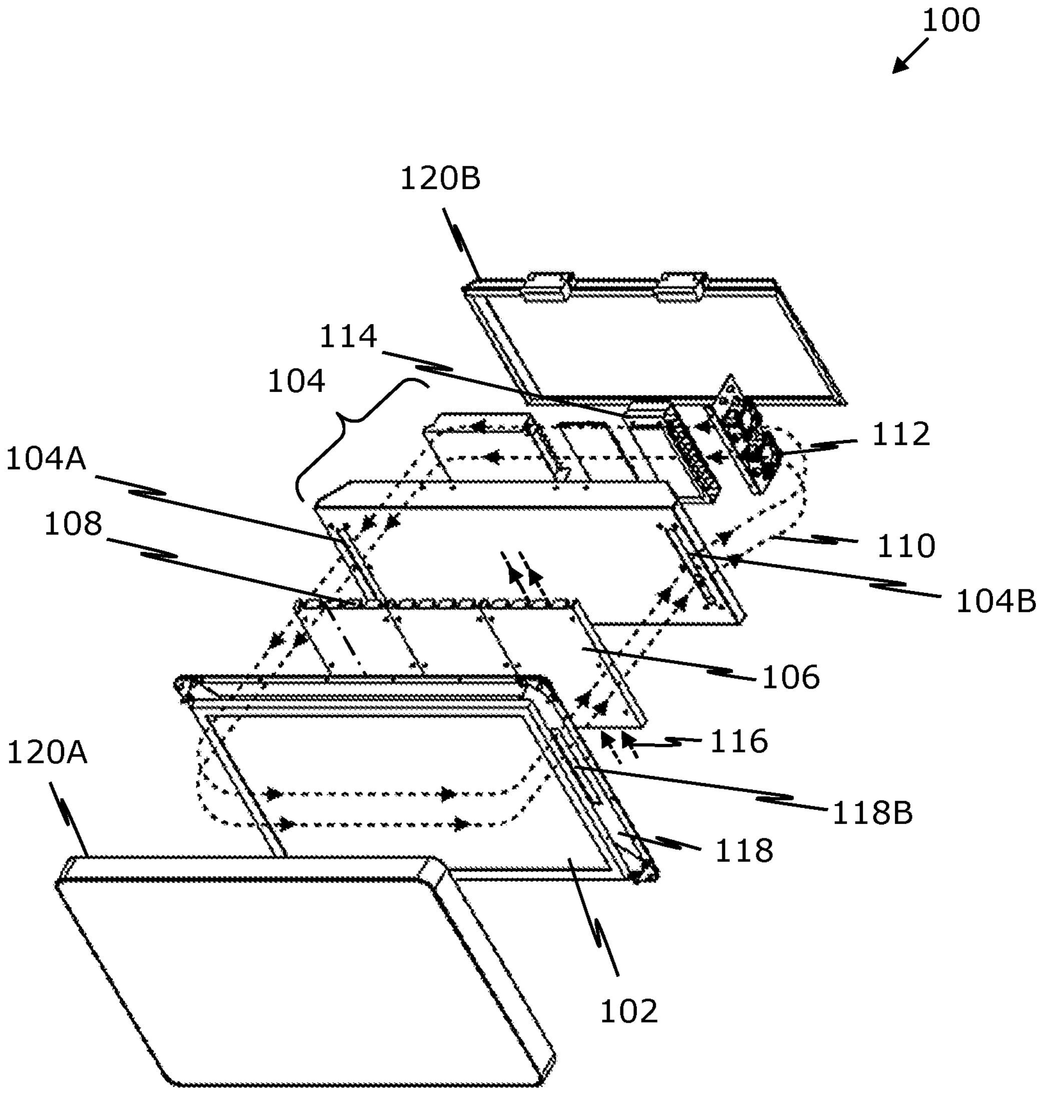
FIGS. 1A, 1B and 1C are an exploded view, a schematic view and a cross-sectional view, respectively, of a cross flow heat transfer apparatus, in accordance with an embodiment of the present disclosure.

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides a cross flow heat transfer apparatus for a combined arrangement comprising an electronic display and an integrated circuit chamber, the cross flow heat transfer apparatus comprising:

- an external heatsink configured to be arranged between the electronic display and the integrated circuit chamber, wherein the external heatsink, comprising a plurality of vertically-oriented fins, is configured to mediate a cross flow heat transfer mechanism between the electronic display and the integrated circuit chamber, wherein the cross flow heat transfer mechanism comprising:
  - an internal flow driven by a set of internal fans associated with an internal heatsink coupled with the integrated circuit chamber, wherein the internal flow is directed transversally towards the electronic display from the integrated circuit chamber, and
  - an external flow driven by the plurality of vertically-oriented fins of the external heatsink based on a temperature gradient.

The present disclosure provides the aforementioned cross flow heat transfer apparatus configured for an efficient and rapid heat dissipation between the electronic display and the integrated circuit chamber. Beneficially, a combination of the internal heat sink and the external heatsink is used to regulate heat effectively between the integrated circuit chamber and the electronic display using internal fans, thereby making the apparatus suitable for use in extreme environments, such as the combined effect of high temperature and direct solar radiation, as well as at extremely low temperature. In this regard, the disclosed apparatus employs an internal air flow on front of the electronic display that does not disturb the user vision due the transparency of the internal gas chamber as well as the use of direct heat conduction element located on the back of the electronic display to act as a heat transfer bridge between the interior conditions of the electronic display and the external naturally occurring air flow. Moreover, the disclosed apparatus avoids use of refrigerating cycles that might include refrigerants and pressurized piping elements that might leak to environment, thereby making the apparatus environmental friendly. Furthermore, the disclosed apparatus is hermetically sealed and limits the dust and external particles to enter therein and thereby prevents the damage of electronic components of the integrated circuit and the electronic display due to the dust and external particles. Additionally, the disclosed apparatus is designed in such a way to easily access the internal components for maintenance or replacement purposes.

Throughout the disclosure, the term "cross flow heat transfer" as used herein refers to the exchange of the thermal energy between two airstreams, such as an internal flow of air and an external flow of air. Typically, the cross flow heat transfer is used for providing cooling and ventilation to the electronic display and the integrated circuit chamber. It will be appreciated that during the cross flow heat transfer one of the two airstreams may be orthogonal to another of the two airstreams. The term "cross flow heat transfer apparatus" as used herein refers to the apparatus configured to perform the cross flow heat transfer. In this regard, the cross flow heat transfer apparatus may employ a plurality of equipment that enable cross flow heat transfer through them, and such plurality of equipment are discussed below in detail.

The term "electronic display" as used herein refers to a display screen that displays visual information transmitted electronically using wired or wireless sources. Moreover, the electronic display may be connected to an external power supply for its intended continuous use. Optionally, the electronic display may be associated with, but is not limited to, a television, a mobile phone, a projector, a monitor, a computer monitor, a laptop computer, a personal computer, an appliance. The term "integrated circuit chamber" as used herein refers to a housing configured to hold one or more integrated circuits therein. Typically, the integrated circuit is an assembly of electronic components with miniature devices built up on a semiconductor substrate. It will be appreciated that the electronic components may be a metal-oxide-semiconductor field-effect transistor (MOSFET), Diode, capacitor, inductor, resistor, CPU, processors, power converters, SDI modules, heat pads, heatsinks, heaters, and other electronic components and the like integrated over the semiconductor substrate. Moreover, the integrated circuit chamber comprises the integrated circuit that results in the heat produced within the apparatus. Typically, the heat may be produced due to working of the one or more electronic components. Notably, the heat transfers from the hotter side to the colder side. For example, if the integrated circuit chamber is producing the heat, then the heat is transferred from the integrated circuit chamber towards the electronic display. Furthermore, the integrated circuit chamber is located at a separate level from the electronic display having the external heatsink in between.

The term "external heatsink" as used herein refers to a heat exchanging component that is used to transfer heat flow away from a hotter object to regulate temperature thereof. Typically, the heatsink is arranged between the electronic display and the integrated circuit chamber to modulate the temperature of the apparatus. In this regard, the hot air from the integrated circuit chamber gets cooled when passes through the heatsink. Moreover, the external heatsink is configured to mediate a cross flow heat transfer mechanism between the electronic display and the integrated circuit chamber. In this regard, the external heat sink allows cross flowing heat to pass through and exchange heat therebetween. Furthermore, the external heatsink of the apparatus is in direct contact with the electronic display acting as a bridge for the heat transfer.

Notably, the external heatsink comprises the plurality of vertically-oriented fins. The term "vertically-oriented fins" as used herein refers to a protruded structure, such as a flat plate for example, that extends from the surface of the external heatsink to increase the rate of heat transfer as the heat is dissipated from one end to another end. Typically, the vertically-oriented fins provide a greater surface area thereby giving more area for the heat to transfer.

Generally, the heat can be transferred in three different ways: convection, radiation and conduction. The heat transfer in the heatsink occurs through conduction. Notably, when two objects with different temperatures come into contact with one another the warmer object transfers the heat energy to the cooler object, which in turn heats the cooler object. This process is known as thermal conductivity. Moreover, the external heatsink is usually made of metal, having a high thermal conductivity that carries heat away. Typically, the external heatsink may be fabricated from, but not limited to, copper, aluminium, metal alloys, graphite. Beneficially, the external heatsink keeps the components of the apparatus safe from overheating and keep the temperature in the desired range to prevent the accumulation of energy by absorbing it.

Optionally, the external heat sink may have different amounts of vertically-oriented fins. Optionally, the vertically-oriented fins may be fabricated from different materials, selected from, but not limited to copper, aluminium, alloys of metals, graphite, and so forth. In this regard, optionally, the vertically-oriented fins may be fabricated from a material different from the material of the external heatsink itself. For example, the external heatsink is made of aluminium while the vertically-oriented fins are made of graphite. Optionally, the external heatsink may comprise vertical holes that enable air to pass therethrough.

The term "internal flow" as used herein refers to an air flow distributing the heat between the integrated circuit chamber and the electronic display. Moreover, the internal flow is driven transversally from the integrated circuit chamber towards the electronic display and back. The term "transversally" as used herein refers to a horizontal flow of air in an axial plane in a pre-defined path, such as a closed loop. Typically, the internal flow is initiated using the set of internal fans associated with the internal heatsink configured within the apparatus. The term "set of internal fans" as used herein refers to two or more fans configured to recirculate the air flow transversally between the integrated circuit chamber and the electronic display in a closed loop. In this regard, the set of internal fans may be configured to drive heat concentration away from the front screen of the electronic display that may be exposed to direct solar radiation.

It will be appreciated that the internal heatsink is configured on the integrated circuit chamber to absorb the heat produced by the integrated circuit by the electronic components when in use and mediate the absorbed heat therefrom to cool the integrated circuit. Optionally, the internal heatsink may be fabricated from the same material as the external heatsink. Moreover, the set of internal fans is structured in a way to orient the flow of the direct air along with the external heatsink thereby drawing heat away from the external heatsink. Furthermore, the set of internal fans suck the internal flow of air and allows the flow of heat in a defined path.

Moreover, the internal flow may be designed to be isolated in a hermetically sealed housing, as it comprises sensitive elements of the electronic display and the integrated circuit controlling it. Furthermore, the hermetically sealed apparatus eliminates any cost on filters usage and maintenance when used in outdoor environments, when a high degree of suspended particles are presented in the surrounding air.

In this regard, optionally, the cross flow heat transfer apparatus comprises an external shell protection to isolate the internal flow of the apparatus from an external environment thereof. The term "external shell protection" as used herein refers to a housing configured to cover the electronic display and the integrated circuit chamber. It will be appreciated that the external shell protection isolates the sensitive elements of the electronic display and the integrated circuit from the environmental influences. Typically, the external shell protection hermetically seals the apparatus to protect the same from moisture, high degree of suspended particles in the surrounding air, and the like. Moreover, the hermetical sealing provided by the external shell protection eliminates the cost of filters usage, a preventive ambient sterilization and an overall maintenance of the apparatus.

Optionally the external shell protection comprises a first enclosure for the electronic display device placed on the proximal end of the apparatus to enable viewing of the screen from the outside by a viewer thereof, and a second enclosure placed on the distal end of the apparatus. Notably, the first enclosure may be made up of a transparent material and the second enclosure may be made up of any of a transparent, an opaque, or a translucent material. In this regard, the first enclosure and the second enclosure are closed together to make the apparatus hermetically sealed. Optionally the external shell protection comprises a lock mechanism configured to lock first enclosure and the second enclosure to hermetically seal the apparatus. Moreover, the locking mechanism provides a convenient opening and closing of the apparatus. Optionally, the locking mechanism acts as a hinged door for easy accessibility of the integrated circuit. In this regard, the apparatus may be open for cleaning and maintenance. Optionally, the lock mechanism may be a snap-fit mechanism, hook lock mechanism, a magnetic lock and the like.

The term "external flow" as used herein refers to a natural air flow due to an external air temperature gradient established between the apparatus and external environment thereof. Typically, the external flow occurs as the air between the external heatsink heats the surrounding air, which rises as it becomes hotter than the surrounding air. It will be appreciated that the external heatsink comprises an inlet for the external flow to pass therethrough and an outlet to reject the air therefrom. Optionally, the inlet and the outlet for the external flow may be a hole, a cavity, an opening and the like. Notably, the cooler air enters from the inlet of the external heatsink due to the temperature gradient to cool the external heatsink exits the external heatsink from the outlet as hot air. The term "temperature gradient" as used herein refers to a physical quantity that describes in which direction and at what rate the air flows with respect to the temperature change around the external heatsink. Optionally, the external flow may be mediated between a pair of vertically-oriented fins.

Optionally, the internal flow and the external flow are perpendicular. The direction of the internal flow and the direction of the external flow are at an angle of 90 degrees to each other. For example, if the internal flow flowing in the horizontal direction in the axial plane parallel to the ground, then the external flow flows vertically making an angle of 90 degrees with the internal flow. Notably, the internal flow flows transversally around the integrated chamber and the electronic display and back, and the external flow, separated from the internal flow, passes orthogonally through the internal flow and in the process the heat is much more efficiently exchanged thereby resulting in a cross flow heat transfer.

Optionally, the external heatsink is in direct contact with a back metal plaque of the electronic display. The term "back metal plaque" as used herein refers to the back cover over which the electronic display is typically placed. In this regard, the back metal plate is in direct contact with the electronic display. Optionally, the back metal plaque occupies more than 70% area of the electronic display. Beneficially, the back metal plate absorbs the heat and cools the electronic display by transferring the heat produced thereby (due to its operation and/or due to the solar radiation) towards the external heatsink. Optionally, the back metal plaque is fabricated from, but not limited to, aluminum, brass, bronze, zinc, stainless steel.

Optionally, between the electronic display and the external heatsink, there may be a layer of thermal protection sheet. Optionally, such thermal protection sheet may be a graphite sheet (such as PGS graphite sheets, a PGS applied products (NASBIS)), or a grease. A technical advantage of using a graphite thermal protection sheet between the electronic display and the external heatsink is that it provides excellent thermal conductivity, almost 2 times as high as copper, 3 to 5 time as high as aluminum, is lightweight and is flexible and easy to be cut or trimmed.

Optionally, the integrated circuit chamber includes a heat generation element configured to inject the necessary amount of heat energy needed to keep the internal temperature of the integrated circuit chamber in viable ranges at extremely low temperatures, wherein the heat energy is directed, by convection, transversally towards the electronic display. The term "heat generation element" used herein refers to a component or a device configured to produce heat by converting electrical energy into heat energy. Notably, during cold weather conditions, the heat generation element is configured to inject the necessary amount of heat energy required by electronic components for their functioning to keep the apparatus under defined temperature limits. Typically, the set of internal fans blows heat generated by the heat generation element and deliver the warm air towards the electronic display. Optionally, the heat generation element may be a heater, heating coil, heating tube and the like. Optionally viable range of the internal temperature of the integrated circuit chamber may be 0° C. to 70° C.

It will be appreciated that when the external temperature is below 0° C. the heat generation element starts to work to keep the electronic display within the internal temperature (namely, the operation temperature window) of the apparatus in a range of 0° C. to 50° C. In simulations with external temperature of −30° C. the heat generating element makes the internal temperature of the apparatus in a range of −5° C.-0° C., thereby making it possible to use the electronic display effectively in the outside environment.

Similarly, in hot environment the heat is transferred from the electronic display to the external heat sink, otherwise the hot air would be concentrated between the electronic display front panel and the covering protecting glass in the case of hot climates and direct solar radiation.

Optionally, the integrated circuit chamber has a first set of cavities, wherein the first set of cavities has an entry cone (A) on the first end and an exit cone (B) on the second end, and the electronic display arranged in a metal casing having a second set of cavities, wherein the second set of cavities have an entry cone (A) on the first end and an exit cone (B) on the second end, corresponding to the first set of cavities, for allowing the internal flow to pass therethrough. The terms "first set of cavities" and "second set of cavities" as used herein refer to openings within the integrated circuit chamber and the metal casing of the electronic display, respectively, that are configured to allow the internal flow to pass therethrough while driven transversally by the set of internal fans from the integrated circuit chamber towards the electronic display and back. Notably, the first and second set of cavities are placed on vertical ends of the integrated circuit chamber and the metal casing of the electronic display, respectively. Optionally, the first and second set of cavities may be implemented as slits, such that the first and second set of cavities correspond to each other. Optionally, cross-sections of the slit are in a range from 15 to 35% of cross-sections of a side walls of the integrated circuit chamber and the metal casing having the slits, respectively. Optionally, the cross-section of the slit is 26% of the cross-section of the side walls of the integrated circuit chamber and the metal casing. In an example, when the side wall of the integrated circuit chamber has a cross-section of 614 mm×80 mm, then the cross-section of the slit is 370 mm×35 mm.

Typically, each of the first and second set of cavities have an entry cone and an exit cone at their respective first end and the second end. In addition, between the entry cone and the exit cone there may be provided a choke section. When the fluid, i.e. air, flows through the choke section, the shrunken cross-section will accelerate the fluid accompanied by a pressure drop. The term "entry cone" as used herein refers to an angle of convergence for a fluid, such as air of the internal flow, passing therethrough. Notably, due to convergence, the cross-sectional area decreases and the internal flow accelerates. The term "exit cone" as used herein refers to an angle of divergence for a fluid, such as air of the internal flow, passing therethrough. Notably, due to divergence, the cross-sectional area increases and the internal flow deaccelerates. It will be appreciated that entry cone and the exit cones of the first and second sets of the cavities provide higher surface area for the internal flow to transfer heat from the hotter object to the colder object within the apparatus.

Optionally, the first set of cavities have the entry cone in different geometry than the exit cone of the second end. Optionally, the entry cone may be greater, smaller or equal to the exit cone. Optionally, the entry cone is in a range of 20 to 40 degrees. The entry cone may typically be from 20, 25, 30 or 35 degrees up to 25, 30, 35 or 40 degrees. Optionally, the entry cone may be of 30 degrees.

Optionally, the second set of cavities have the entry cone in different geometry than the exit cone. Optionally, the exit cone may be greater, smaller or equal to the entry cone. Optionally, the exit cone is in a range of 0 to 10 degrees. The exit cone may typically be from 0, 1, 2, 3, 4, 5, 6, 7, 8 or 9 degrees up to 2, 3, 4, 5, 6, 7, 8, 9 or 10 degrees. Optionally, the exit cone may be of 5 degrees.

Optionally, each of the first set of cavities and the second set of cavities are filled in with venturi tubes, wherein the venture tubes have an entry cone in different geometry than an exit cone. The term "venturi tube" as used herein refers to a tube having a short pipe consisting of two conical parts with a short portion of a uniform cross-section in between. Notably, the venturi tube is placed inside the first and second set of cavities. Optionally, the venturi tubes are designed in such a way that it allows the internal flow to pass therethrough by increasing the cooling by twisting the air flow. In addition, the conical part of the venturi tube act as an inlet and outlet. It will be appreciated that the inlet act as the convergent and the outlet act as the divergent. In this way the inlet act as the entry cone and the outlet act as the exit cone. Optionally, the entry cone of the venturi tubes is in a range of 20 to 40 degrees. The entry cone of the venturi tubes may typically be from 20, 25, 30 or 35 degrees up to 25, 30, 35 or 40 degrees. Optionally, the entry cone of the venturi tubes may be of 30 degrees. Optionally, the exit cone of the venturi tubes is in a range of 0 to 10 degrees. The exit cone of the venturi tubes may typically be from 0, 1, 2, 3, 4, 5, 6, 7, 8 or 9 degrees up to 2, 3, 4, 5, 6, 7, 8, 9 or 10 degrees. Optionally, the exit cone of the venturi tubes may be of 5 degrees. In this regard, it will be appreciated that the entry and exit cones of the venturi tube may be same or different from the entry and exit cones of the first and second set of cavities.

Alternatively, the first set of cavities and the second set of cavities are designed to mimic venturi effect, without actually having the venturi tubes filled therein, to create air circulation beyond the first and second set of cavities for more efficient cooling or warming effect. Alternatively, optionally, the first set of cavities may have venturi tubes therein, while the second set of cavities may not have the venturi tubes therein. Beneficially, said design would save cost of including the venturi tubes in the first and/or second set of cavities.

It will be appreciated that the venturi effect may provide best results when used in the second set of cavities while the air flow turbulence (air twist) happens on the front of the electronic display.

Optionally, the transversal internal flow occurs in a closed loop between the electronic display and the integrated circuit chamber, and wherein the transversal internal flow passes through the first set of cavities and the second set of cavities in the closed loop. In this regard, the internal flow occurs in the predefined path around the electronic display and the integrated circuit chamber, initiating from the integrated circuit chamber and ending at the integrated circuit chamber while passing through the electronic display in a closed loop. Operatively, the internal flow first passes through the first set of cavities placed on the integrated circuit chamber then passes to the second set cavities in the metal casing of the electronic display where it cools the electronic display then again passes to the oppositely placed second set of cavities in the metal casing and then finally passes through the oppositely placed first set of cavities in the integrated circuit chamber to complete one heat transfer loop.

DETAILED DESCRIPTION OF THE DRAWINGS

Figure 1B:
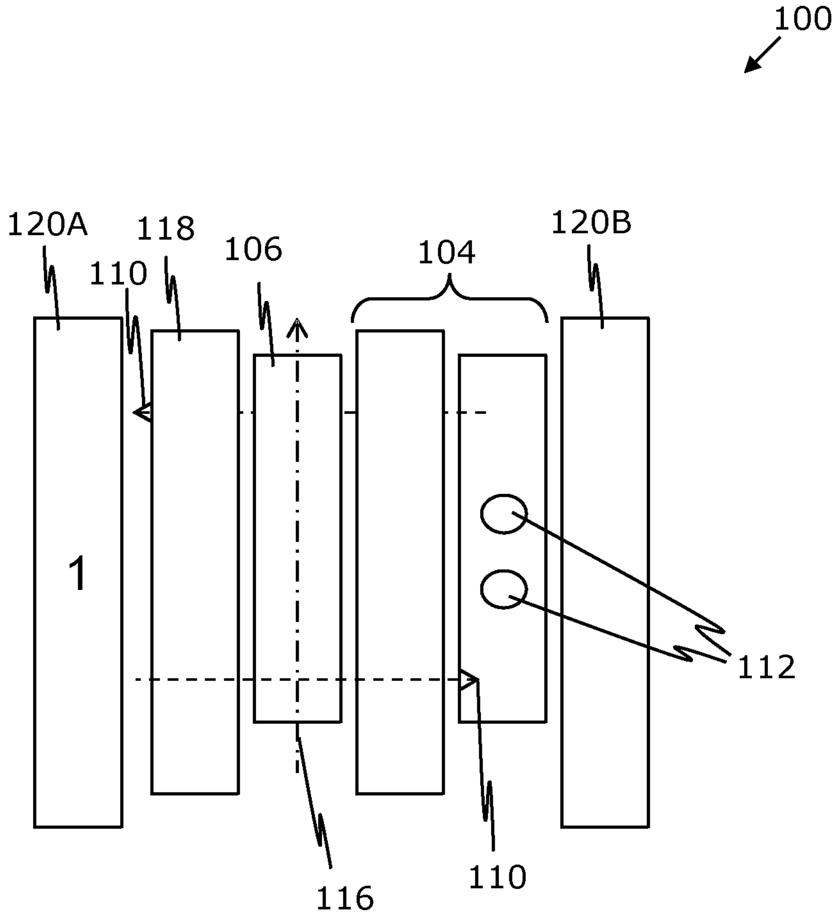
Figure 1C:
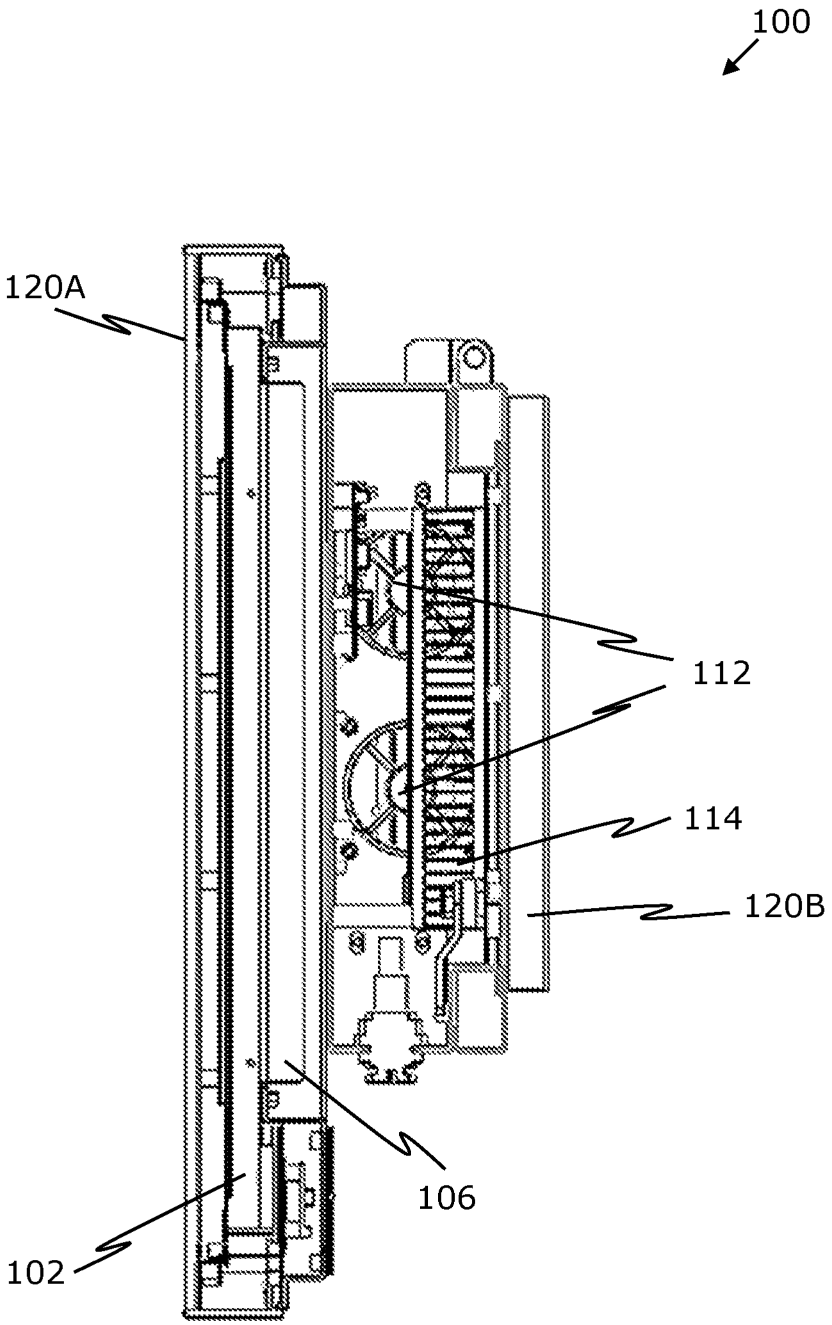

Referring to FIGS. 1A, 1B and 1C, illustrated are an exploded view, a schematic view and a cross-sectional view, respectively, of a cross flow heat transfer apparatus 100, in accordance with an embodiment of the present disclosure. The cross flow heat transfer apparatus 100 comprises an electronic display 102, an integrated circuit chamber 104, and an external heatsink 106 configured to be arranged between the electronic display 102 and the integrated circuit chamber 104. In this regard, the external heatsink 106, comprising a plurality of vertically-oriented fins 108, is configured to mediate a cross flow heat transfer mechanism between the electronic display 102 and the integrated circuit chamber 104. Moreover, the cross flow heat transfer mechanism comprises an internal flow 110 driven by a set of internal fans 112 associated with an internal heatsink 114 coupled with the integrated circuit chamber 104, wherein the internal flow 110 is directed transversally towards the electronic display 102 from the integrated circuit chamber 104, and an external flow 116 driven by the plurality of vertically-oriented fins 108 of the external heatsink based on a temperature gradient. The integrated circuit chamber 104 has a first set of cavities (104A, 104B) placed on opposite vertical edges thereof. The electronic display 102 is arranged in a metal casing 118 having a second set of cavities (118A (not visible), 118B) placed on opposite edges thereof. Furthermore, the cross flow heat transfer apparatus 100 comprises an external shell protection to isolate the internal flow 110. The external shell protection having proximal end 120A covering the electronic display 102 and the distal end 120B covering the integrated circuit chamber 104.

Figure 2A:
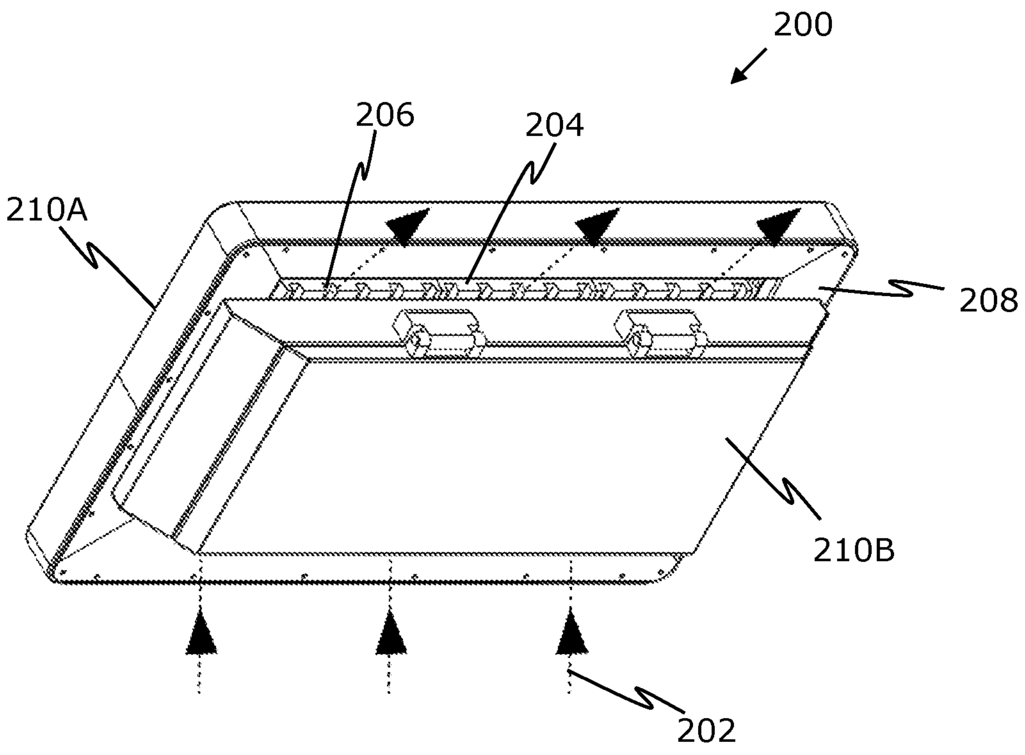
FIGS. 2A and 2B are a perspective view and a cross-sectional view, respectively, of a cross flow heat transfer apparatus depicting an external flow, in accordance with an embodiment of the present disclosure.
Figure 2B:
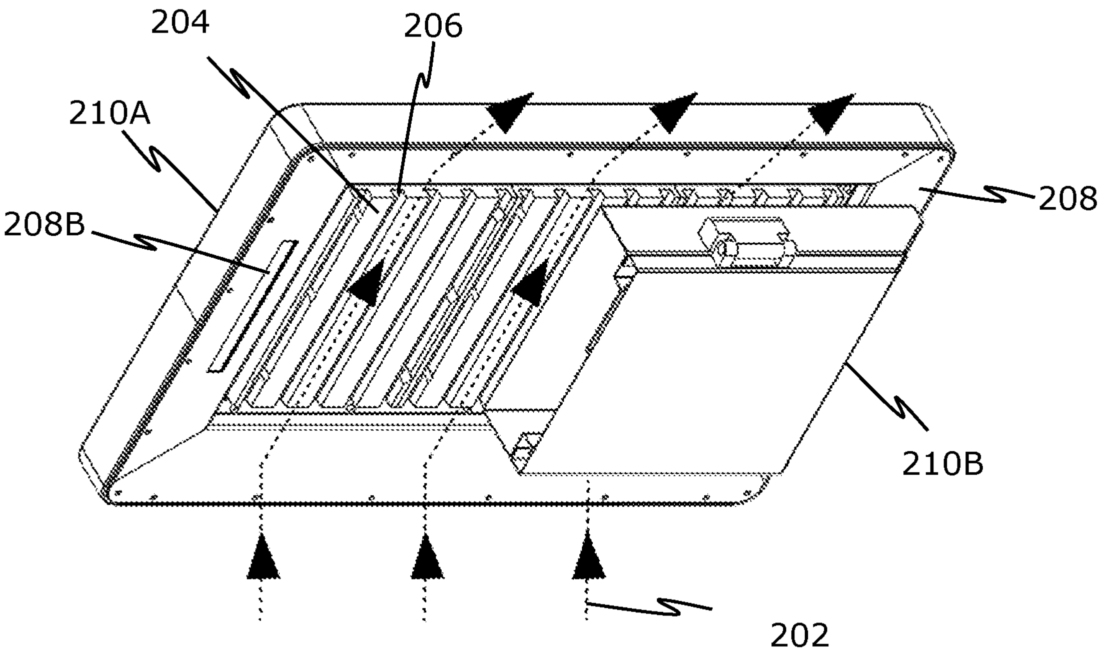

Referring to FIGS. 2A and 2B illustrated are a perspective view and a cross-sectional view, respectively, of a cross flow heat transfer apparatus 200 depicting an external flow, in accordance with an embodiment of the present disclosure. As shown, the external flow 202 is driven by a temperature gradient through the plurality of vertically-oriented fins 204 of the external heatsink 206. In this regard, the surrounding air of the environment passes through the vertically-oriented fins 204 of the external heatsink 206. Moreover, the electronic display is arranged in a metal casing 208 having a second set of cavities (208A (not visible), 208B). Notably, the cross flow heat transfer apparatus 200 comprises external shell protection having proximal end 210A and distal end 210B.

Figure 3:
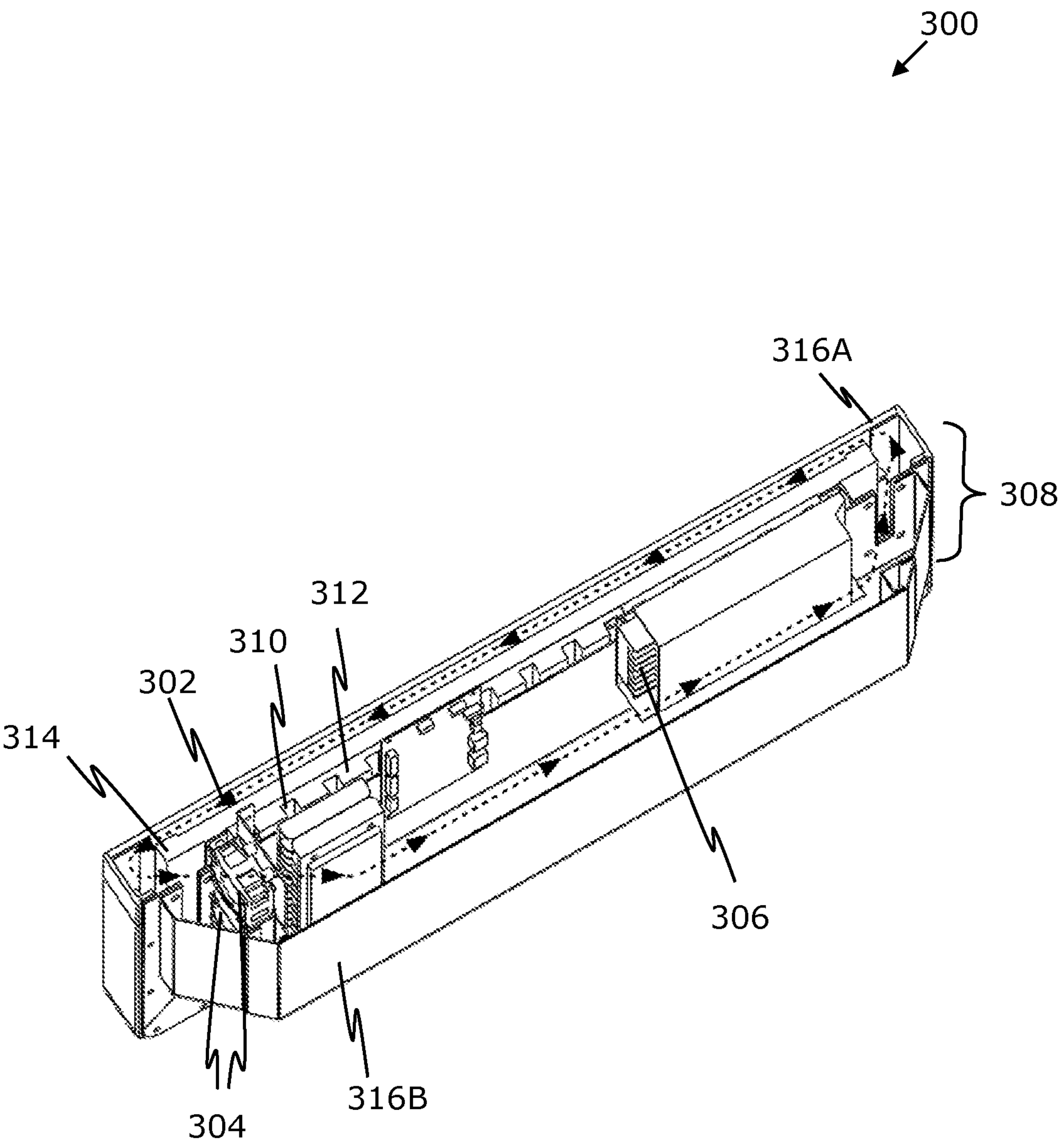
FIG. 3 is a cross-sectional view of a cross flow heat transfer apparatus depicting an internal flow, in accordance with an embodiment of the present disclosure.

Referring to FIG. 3 illustrated is a cross-sectional view of a cross flow heat transfer apparatus 300 depicting an internal flow, in accordance with an embodiment of the present disclosure. The cross flow heat transfer mechanism comprising an internal flow 302 driven by a set of internal fans 304 associated with an internal heatsink 306 coupled with the integrated circuit chamber 308, wherein the internal flow 302 is directed transversally towards the electronic display (not shown) from the integrated circuit chamber 308 having external heatsink 310 in between having vertically-oriented fins 312. The internal flow 302 occurs in a closed loop between the electronic display arranged in a metal casing 314 and the integrated circuit chamber 308. The cross flow heat transfer apparatus 300 comprises the external shell protection having proximal end 316A covering the electronic display and proximal end 316B covering the integrated circuit chamber 308.

Figure 4:
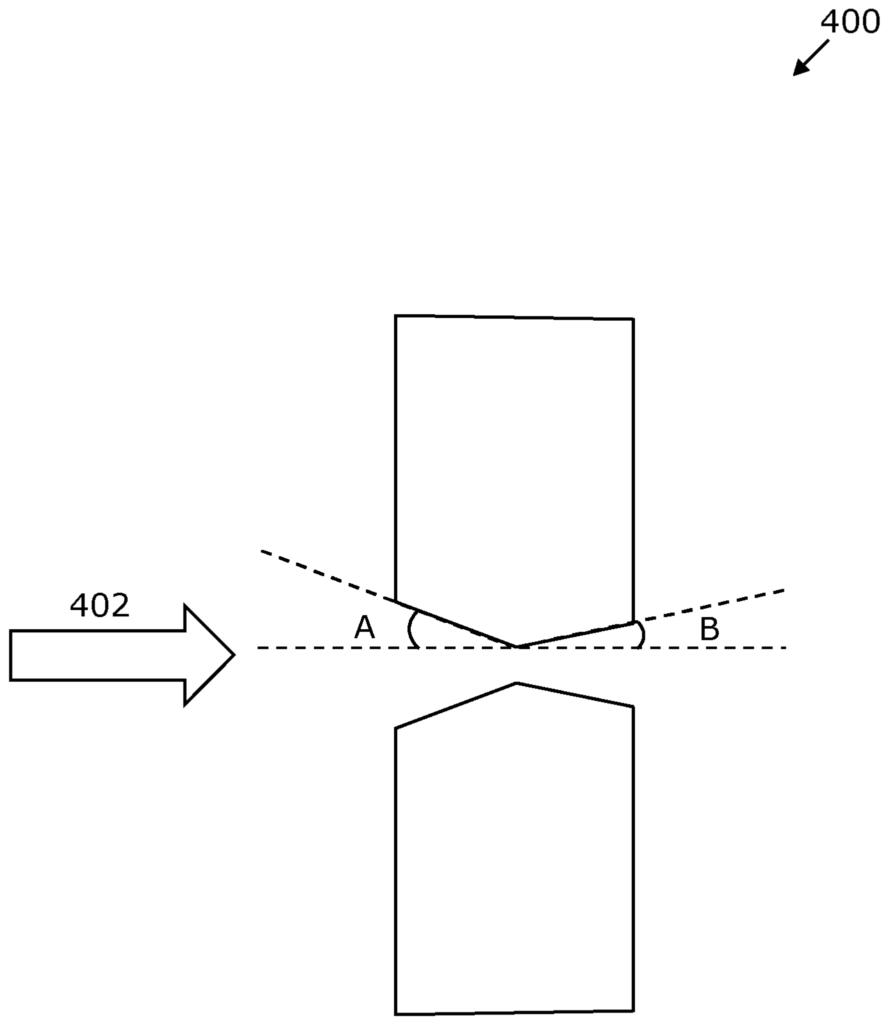
FIG. 4 is a cross-sectional view of a venturi tube, in accordance with an embodiment of the present disclosure.

Referring to FIG. 4 is a cross-sectional view of a venturi tube 400, in accordance with an embodiment of the present disclosure. As shown, the venture tube 400 has an entry cone A and an exit cone B. Typically, the internal flow 402 passes through the entry cone A and leaves the exit cone B of the venturi tube 400. Moreover, the first set of cavities and the second set of cavities of the integrated circuit chamber and the metal casing, respectively are filled in with venturi tubes, such as the venturi tube 400.

Referring to FIGS. 5A and 5B are tables showing various combinations of an entry cone and an exit cone of a first set of cavities and a second set of cavities, in accordance with various embodiments of the present disclosure. As shown in the FIG. 5A, "1" represents that the entry cone is greater than the exit cone of the cavity and "0" represents that the entry cone and the exit cone of the cavity are the same. For example, in combination "0", the cavities 104A and 104B of the first set of cavities 104 and the cavities 118A and 118B of the second set of cavities 118 have entry cone equal to/same as the exit cone thereof. In combination "7", the cavity 104A of the first set of cavities 104 has the entry cone same as the exit cone thereof. Moreover, the cavities 118A and 118B of the second set of cavities 118 and the cavity 104B of the first set of cavities 104 has the entry cone greater than the exit cone thereof.

As shown, the FIG. 5B, "1" represents that the entry cone is smaller than the exit cone of the cavity and "0" represents the entry cone and exit cone of the cavity to be the same. In combination "0", the cavities 104A and 104B of the first set of cavities 104 and the cavities 118A and 118B of the second set of cavities 118 has the entry cone same as the exit cone thereof. In combination "7", the cavity 104A of the first set of cavities 104 has the entry cone equal to/same as the exit cone thereof. Moreover, the cavities 118A and 118B of the second set of cavities 118 and the cavity 104B of the first set of cavities 104 has the entry cone smaller than the exit cone thereof.

Modifications to embodiments of the present disclosure described in the foregoing are possible without departing from the scope of the present disclosure as defined by the accompanying claims. Expressions such as “including”, “comprising”, “incorporating”, “have”, “is” used to describe and claim the present disclosure are intended to be construed in a non-exclusive manner, namely allowing for items, components or elements not explicitly described also to be present. Reference to the singular is also to be construed to relate to the plural.

The invention claimed is:

1. A cross flow heat transfer apparatus for a combined arrangement comprising an electronic display and an integrated circuit chamber, the cross flow heat transfer apparatus comprising:

an external heatsink configured to be arranged between the electronic display and the integrated circuit chamber, wherein the external heatsink, comprising a plurality of vertically-oriented fins, is configured to mediate a cross flow heat transfer mechanism between the electronic display and the integrated circuit chamber, wherein the cross flow heat transfer mechanism comprises:

an internal flow driven by a set of internal fans associated with an internal heatsink coupled with the integrated circuit chamber, wherein the internal flow is directed transversally towards the electronic display from the integrated circuit chamber, and an external flow driven by the plurality of vertically-oriented fins of the external heatsink based on a temperature gradient; and wherein the integrated circuit chamber comprises a first set of cavities, the first set of cavities having an entry cone (A) on a first end and an exit cone (B) on a second end;

the electronic display being arranged in a metal casing having a second set of cavities, the second set of cavities have an entry cone on the first end of the first set of cavities and an exit cone on the second end of the first set of cavities, the second set of cavities being configured for allowing the internal flow to pass therethrough.

2. The cross flow heat transfer apparatus according to claim 1, wherein the external heatsink is in direct contact with a back metal plaque of the electronic display.

3. The cross flow heat transfer apparatus according to claim 1, wherein the internal flow and the external flow are perpendicular.

4. The cross flow heat transfer apparatus according to claim 1, wherein the cross flow heat transfer apparatus comprises an external shell protection to isolate the internal flow of the apparatus from an external environment thereof.

5. The cross flow heat transfer apparatus according to claim 1 wherein the integrated circuit chamber includes a heat generation element configured to inject the necessary amount of heat energy needed to keep the internal temperature of the integrated circuit chamber in viable ranges at extremely low temperatures, wherein the heat energy is directed, by convection, transversally towards the electronic display.

6. The cross flow heat transfer apparatus according to claim 1, wherein the first set of cavities have the entry cone (A) in a different geometry than the exit cone (B) of the second end.

7. The cross flow heat transfer apparatus according to claim 1, wherein the second set of cavities-, have the entry cone (A) in a different geometry than the exit cone (B).

8. The cross flow heat transfer apparatus according to claim 1, wherein each of the first set of cavities and the second set of cavities are filled in with venturi tubes, wherein the venture tubes have an entry cone (A) in a different geometry than the exit cone (B).

9. The cross flow heat transfer apparatus according to claim 1, wherein the transversal internal flow occurs in a closed loop between the electronic display and the integrated circuit chamber, and wherein the transversal internal flow passes through the first set of cavities and the second set of cavities in the closed loop.

* * * * *